United States Patent [19]

Puech et al.

[11] 4,286,232

[45] Aug. 25, 1981

[54] LASER WITH DISTRIBUTED REFLECTOR

[75] Inventors: Claude Puech; Pierre Leclerc; Baudouin de Cremoux; Pierre Hirtz; Marie A. Di Forte, all of Paris, France

[73] Assignee: Thomson-CSF, Paris, France

[21] Appl. No.: 46,316

[22] Filed: Jun. 7, 1979

[30] Foreign Application Priority Data

Jun. 9, 1978 [FR] France ................. 78 17281

[51] Int. Cl.³ .............................................. H01S 3/19
[52] U.S. Cl. ......................... 331/94.5 H; 350/96.15
[58] Field of Search ................... 331/94.5 H, 94.5 C; 350/96.11, 96.12, 96.13, 96.14, 96.15, 96.17, 96.19

[56] References Cited

U.S. PATENT DOCUMENTS

| | | | |
|---|---|---|---|
| 3,943,462 | 3/1976 | Thompson | 331/94.5 H |
| 4,039,249 | 8/1977 | Kaminow et al. | 350/96.11 |
| 4,054,363 | 10/1977 | Suematsu | 350/96.11 |
| 4,156,206 | 5/1979 | Comerford et al. | 331/94.5 H |

FOREIGN PATENT DOCUMENTS 2257913 8/1975 France ................. 331/94.5 H

OTHER PUBLICATIONS

Yen et al, "GaAs Distributed Bragg Reflector Lasers", *Optics Communications,* vol. 17, No. 3, Jun. 1976, pp. 213–218.

L. D. Comerford et al., "Offset Laser To Groove Waveguide Coupler", *IBM Technical Disclosure Bulletin,* vol. 20, No. 4, Sep. 1977, pp. 1606–1608.

*Primary Examiner*—James W. Davis
*Attorney, Agent, or Firm*—Cushman, Darby & Cushman

[57] ABSTRACT

The invention relates to a semiconductor laser with a distributed reflector comprising a semiconductor junction, one of whose semi-transparent mirrors is a split face of the semiconductor in which is integrated a light emitting junction with epitaxial layers. The active layer of this junction is coupled to a waveguide integrated in a dielectric medium, on one face of which is engraved a grating forming a distributed reflector playing the part of the second mirror. The reflector, when functioning according the second order of counter coupling emits a diffracted wave normal to the waveguide which can easily be coupled to an optical fiber.

9 Claims, 8 Drawing Figures

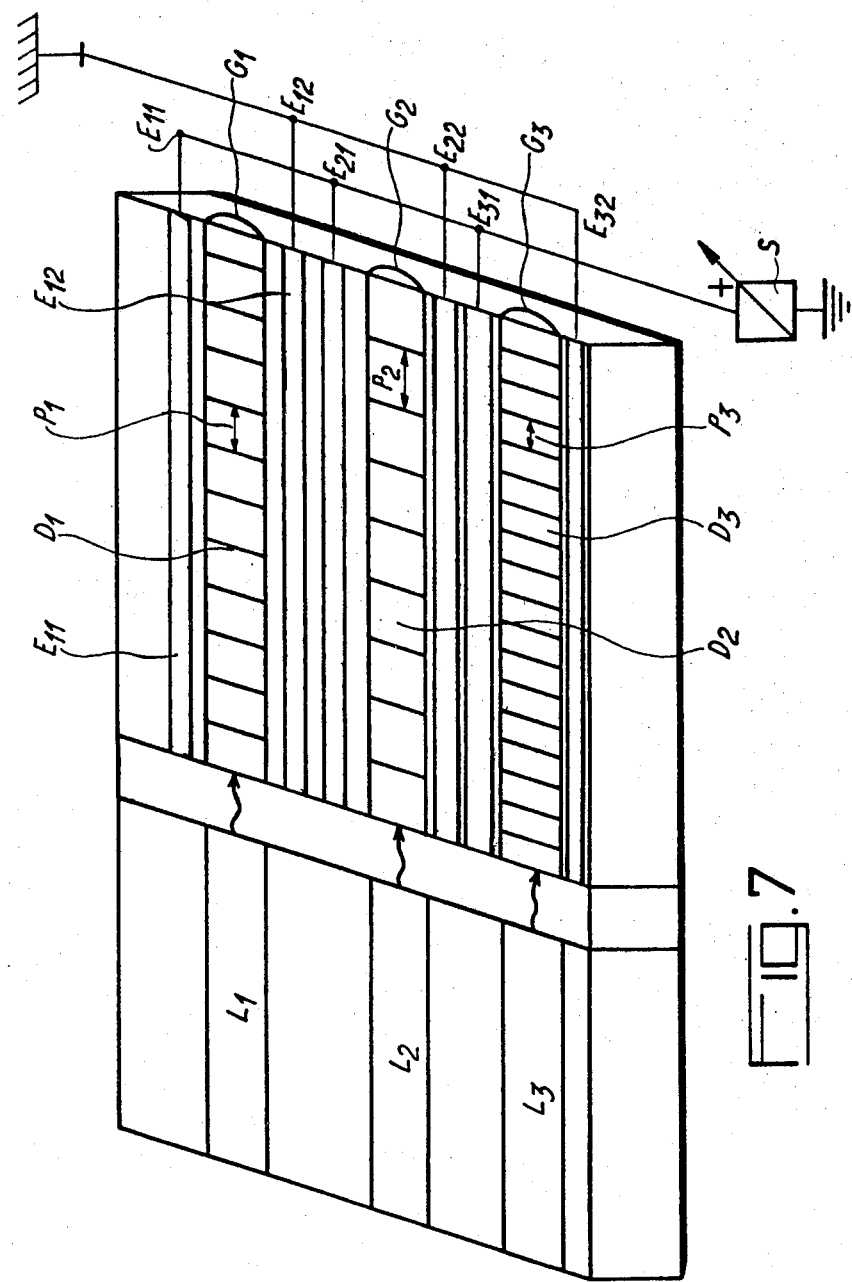

LASER WITH DISTRIBUTED REFLECTOR

The invention relates to a semiconductor laser with a distributed reflector.

Two sorts of semiconductor lasers are known. On the one hand, cavity type lasers comprise a diode formed from a monocrystal cleaved on two faces and, in this crystal, a so-called "active" zone is included in which, when the diode is forward biased, the electrons and holes recombine. The active layer, which extends parallel to the junctions and is delimited by the two cleaved faces, forms a Fabrey Perot cavity, which enables stimulated light emission that is released outwardly from the two cleaved faces. These lasers are of low directivity and, as the thickness of the active zone is of the order of 0.1 to 1 $\mu$m, it may not easily be coupled to an optical fiber with suitable efficiency.

In the second place, distributed resonantor type or distributed reflector type lasers have one or two periodic spatial structures on one of the parameters of which the light propagation depends, this grating structure being distributed along the active zone for lasers with distributed resonator or located on both sides of the active zone for lasers with distributed reflectors. These types of lasers have interesting features. Light diffracted from the grating structure propagates normal to the junctions when the second feedback order is used and the light beam is wider and more directional, making easier the coupling to an optical fiber.

There is nonetheless the drawback that they are difficult to manufacture because the gratings are formed in the semiconductor, an epitaxial layer having to be formed on the gratings. In addition, the light is a source of heat. Consequently, it is necessary to place a cooling system close to the epitaxial layers. The light emitted normal to the junctions has to pass through the substrate, which considerably reduces the efficiency of such diodes.

The present invention relates to a semiconductor laser which possesses the advantages of these two types of lasers, without their drawbacks.

According to the present invention, there is provided a laser with distributed reflector comprising a semiconductor junction formed by a substrate and epitaxial layers having one cleaved plane face normal to the epitaxial layers, one of said epitaxial layers being an active layer comprising a zone providing stimulated emission, said laser further comprising a transparent dielectric medium in which is formed a waveguide, said waveguide being coextensive of said active layer and optically coupled to the side of said junction opposite said cleaved plane face, a grating forming a distributed reflector being formed on a face of said waveguide, said grating cooperating with said cleaved face to form an optical cavity including said active layer.

The invention will be more readily understood from the following description with reference to the accompanying drawings, wherein:

FIG. 7 shows a multiple laser with distributed reflectors;

Figure 1:
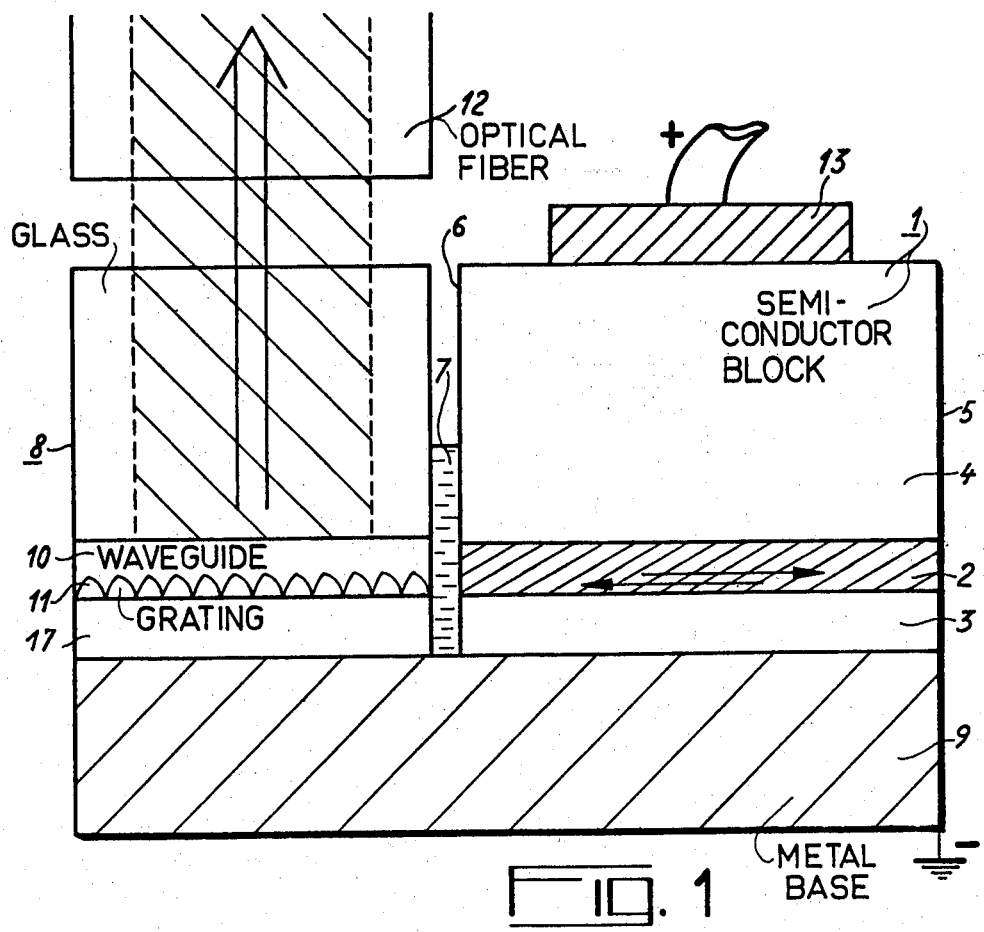
FIG. 1 is a cross-section of a first embodiment of the laser with a distributed reflector according to the invention.

FIG. 1 shows a semiconductor block 1, made for example, of GaAs substrate 4, and epitaxially grown layers 2 and 3 of GaAlAs, the proportions of Al and Ga (aluminium and Gallium not being the same in the layers 2 and 3 so as to form a hetero-junction. One of these layers, the so-called active zone 2, is delimited on the right-hand portion by a cleaved face 5 of the block. The layers 2 and 3 have a n type conductivity and the sub-state 4, has a p type conductivity. The layers of the junction have forbidden band widths such that, if the assembly is forward biased the electrons and holes recombine in the active zone thereby initiating light radiation.

According to the invention, the other face 6 of the block is coupled by means of a transparent liquid 7 to a block of glass 8. The block 1 is soldered on the side of the epitaxial layers on a base 9 made of metal, which provides electrical contact to the diode and a heat sink cooling the assembly. The glass block 8 lies on the same base 9 through a spacer 17. In the glass block, an optical waveguide 10 has been provided using known methods, for example by produced a modification of the refractive index. This waveguide is optically coupled, via the liquid 7, with the active zone 2. A periodic structure 11 forming a diffraction grating with a pitch P has been printed on one of the walls of this waveguide, using known processes of holographic photolithography and ionic engraving.

As the index of active layer 2 is $n_1$, that of the glass being $n_2$, the index $n_3$, of the liquid for index matching will be selected in such a way that $n_3 \simeq \sqrt{n_1 n_2}$. A contact, 13, is provided on the upper face of the diode block 1. The top of the glass block 8 is coupled to an optical fiber 12.

Figure 2:
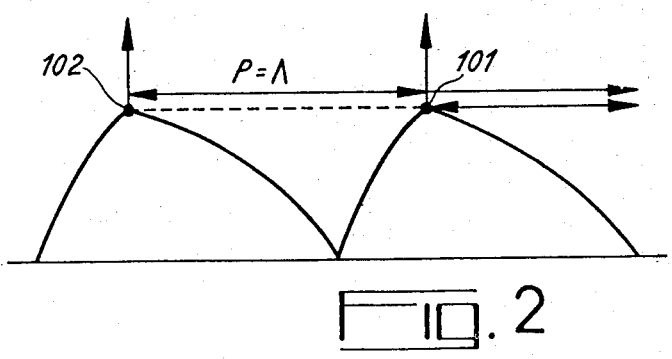
FIG. 2 is a cross-section of a detail of FIG. 1.

The assembly functions as follows: with junction 1 forward biased, if the pitch of the periodic structure P is equal to $K\lambda/2n_2$ where $\lambda/n_2$ is the apparent wavelength in the glass, k being the feedback order and P corresponding to a frequency comprised in the passband determined by the forbidden band in layer 2, the assembly active layer 2 and waveguide 10 form a laser comprising an optical cavity bounded by two mirrors, one of whose mirrors is the cleaved face 5 of the semiconductor located to the right in the figure, and the other, the grating formed in the waveguide 10. If the pitch P of the grating is equal to $\Lambda = -\lambda/n_2$ as can be seen in FIG. 2, any ray reflected by a projecting portion, 101, in the waveguide will be in phase with a ray feflected by the next projecting portion, 102, a ray which, upon returning to projection 101, will have travelled a distance of 2 $\Lambda$. P being equal to $\Lambda(k=2)$, the distributed reflector functions according to the second feedback order and all the projections being energized in phase, an optical wave is broadside radiated according the zero order of diffraction in the direction of the arrow normal to the system. This wave passes through the glass block and is coupled to the optical fiber 12. This provides a three fold advantage.

(a) the refractive index in the glass is lower than in the gallium arsenide; $n_1 = 3.6$, $n_2 = 1.5$. The pitch of the grating can be 2.4 times greater than in a GaAs laser with a distributed resonator or distributed reflectors in which the gratings are formed in the semiconductor, for a working according the same order k.

(b) the lack of transparency of the GaAs substrate to radiation does not create any transmission problem as outward radiation takes place through the glass.

(c) finally, the distributed reflector of the system makes it possible to select the spectral line of emission in the pass-band of the laser with great precision.

Other devices can be designed without departing from the scope of the invention.

Figure 3:
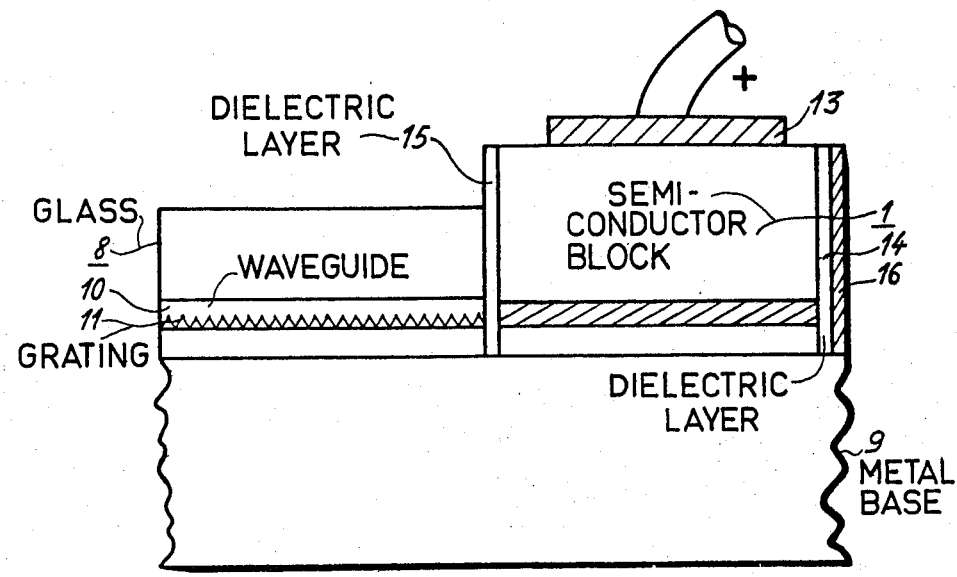
FIG. 3 is a cross-section of a second embodiment of the laser according to the invention.
Figure 4:
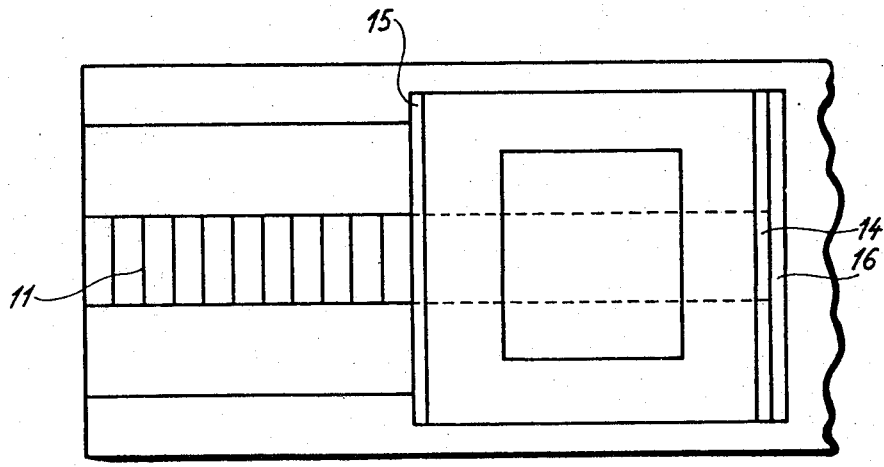
FIG. 4 is a top view of the embodiment of FIG. 3.

FIG. 3 is a cross-section and FIG. 4 a top view, of a second embodiment. The block 1 is covered, on its cleaved face and on the opposite face respectively, with two transparent dielectric layers, 15 and 14, whose thickness corresponds to a quarter wavelength, allowing for the refractive index in said layers. Such layers, on one hand, prevent the reflection on the outer faces of layers 14 and 15 from taking part in the laser cavity feedback. In fact, the reflected waves are in phase opposition with the waves resulting from feedback by the distributed reflector. This makes it possible, in order to eliminate unwanted radiation by the right hand end of the laser, to cover layer 14 with a layer of gold 16 finally, to dispense with the index adaptation fluid 7. The device is then simplified and its efficiency is improved, all radiation to the right being eliminated, together with losses in the matching fluid, which is no longer necessary.

Figure 6:
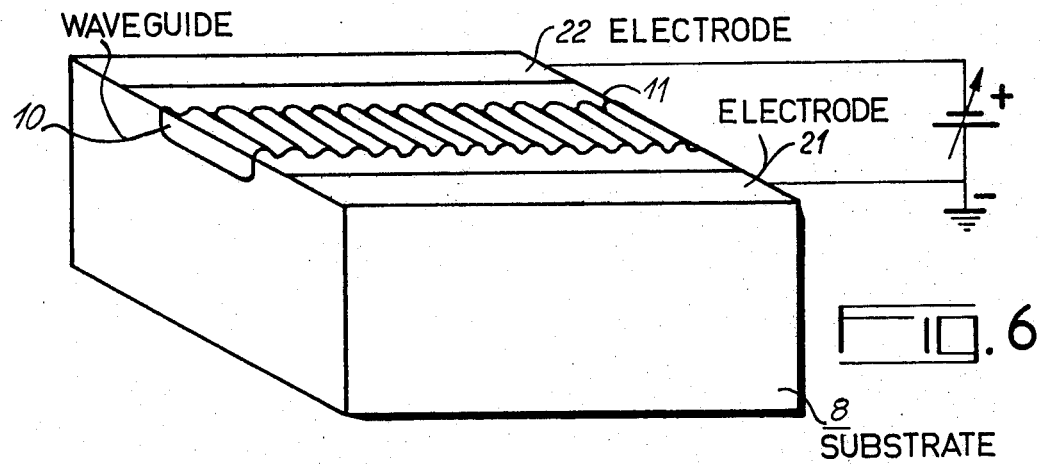
FIG. 6 is a perspective view of a waveguide with a distributed reflector made of an electro-optical material.

The invention offers another possibility. The waveguide and the associated distributed reflector can be made of an electro-optical material, for example lithium niobate ($LiNbO_3$). The formation of waveguides by diffusion of metal ions, for example titanium (Ti), in such a material is known in the art. Such a waveguide and the associated substrate are shown in FIG. 6; the waveguide 10 obtained by metallic diffusion in the substrate 8, is shown inverted in relation to the preceding drawings. By placing two gold electrodes, 21 and 22, on either side of the waveguide and by applying a an adjustable voltage between these two electrodes, it is possible to vary the refractive index n in the material and, consequently, the wavelength $\lambda$ emitted. This permits fine adjustment of the wavelength emitted.

Figure 5:
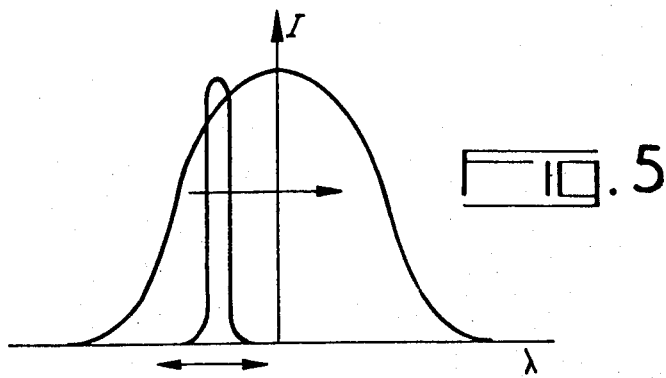
FIG. 5 is an explanatory graph.

FIG. 5 shows the light energy curve as a function of the wavelength $\lambda$. The distributed reflector allows the choice of a narrow band in the emission band. Furthermore, by adjusting the voltage applied between the two electrodes, for example by gradually varying the voltage from 0 to 10 or 20 V, emission "lines" can be tuned with a grating having a defined pitch P. If the wave guide is formed, in $LiNbO_3$ whose index is n = 2.3, the induced variation in index for a variation in voltage of 1 V is $\Delta n = 10^{-3}$. The emitted wave $\lambda = (2nP/k)$ has a relative variation $(\Delta\lambda/\lambda) = (\Delta n/n)$; for $\lambda = 8600$ Å, $\Delta\lambda = 3.7$ Å.

It is therefore possible to adjust the emission frequency very precisely in the band of the laser, that is to say, by applying a given voltage, to select the emission line in the emission band of the laser very precisely.

FIG. 7 is a very schematic representation of a multiple channel laser enabling the emission of waves of different wavelengths to be obtained with grating reflectors having different pitches P. The assembly is a perspective view of three junctions $L_1$, $L_2$ and $L_3$, formed on the same substrate and shown as viewed from the side of the epitaxial layers; channels $L_1$, $L_2$ and $L_3$ are arranged parallel and formed in the same active layer. We are able, using known techniques, to confine stimulated emission in determined portions of the active layer of a light emitting diode. Laser channels $L_1$, $L_2$ and $L_3$ are coupled to three waveguides, $G_1$, $G_2$ and $G_3$ formed, as shown in FIG. 6, in an electrooptical material. On said guides are formed gratings distributed reflectors $D_1$, $D_2$, $D_3$, with differing pitches, $P_1$, $P_2$, $P_3$. They are controlled respectively by electrodes $E_{12}$, $E_{22}$, $E_{32}$ connected to earth, and $E_{11}$, $E_{21}$, $E_{31}$, connected to one and the same + terminal of a tunable voltage source S.

Figure 8:
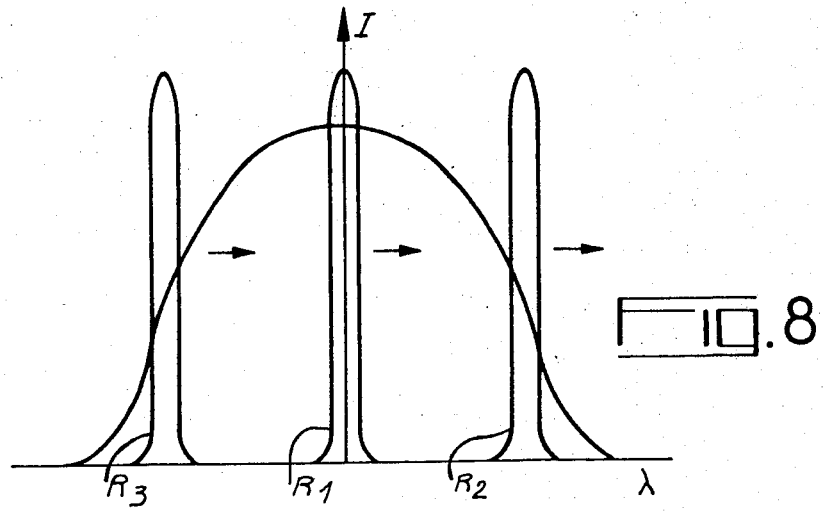
FIG. 8 is an explanatory graph.

A spectral response, $R_1$, $R_2$ or $R_3$ (FIG. 8) corresponds to each pitch and the spectral responses can be displaced by varying the voltage.

In the above detailed embodiments of the laser with distributed reflector according to the invention, two examples of substrate in which waveguides can be formed has been mentioned: glass (dioxide silicon) and lithium Niobate. This substrate can be any other transparent dielectric material in which waveguides and gratings can be formed.

What we claim is:

1. A solid state laser source comprising a base, a block of semiconductor material positioned on said base, and a further block of refringent material located on said base in a position contiguous of said block; said block comprising epitaxial layers and electrode means for forward biasing at least one active zone of one of said epitaxial layers, said further block comprising an integrated waveguide sized for collecting at one exit end of said zone the stimulated emission arising from said forward biasing and reflected from a cleaved face of said block; a grating of surface irregularities being engraved in that face of said further block wherein said waveguide is integrated; the uniform pitch of said grating being equal to one wavelength pertaining to the wavelength band of said stimulated emission; the lines of said grating being arranged parallel to said cleaved face for simultaneously providing the biasing feedback along a direction normal to said cleaved face and the light output parallel to said cleaved face.

2. A source as claimed in claim 1, further comprising an optical fiber optically coupled to said further block for collecting said light output.

3. A source as claimed in claim 1, wherein optical matching means are provided between said blocks.

4. A source as claimed in claim 1, wherein the refractive index of said further block is smaller than the refractive index of said block of semiconductor material.

5. A source as claimed in claim 4, wherein said further block is made of silicon dioxide.

6. A source as claimed in claim 1, wherein said further block is made of an electro-optical material; electrode means being provided for electrically controlling the refractive index of said electro-optical material.

7. A source as claimed in claim 6, wherein said electro-optical material is lithium niobate; said integrated waveguide being a titanium diffused zone.

8. A source as claimed in claim 1, wherein said block comprises a set of parallel active zones formed in one of said epitaxial layers; first further block comprising a set of integrated waveguides respectively sized for collecting the stimulated emissions arising in said active zones and reflected from said cleaved face; gratings having distinct pitches respectively overlaying said integrated waveguides to simultaneously provide biasing feedbacks for said active zones and light output parallel to said cleaved face.

9. A source as claimed in claim 1, wherein said base is metallic.

* * * * *